(12) United States Patent
Wang et al.

(10) Patent No.: US 11,876,294 B2
(45) Date of Patent: Jan. 16, 2024

(54) RESONATOR-DIPLEXER-ANTENNA

(71) Applicant: POLYVALOR, LIMITED PARTNERSHIP, Montréal (CA)

(72) Inventors: Kuangda Wang, Montreal (CA); Anthony Ghiotto, Begles (FR); Wu Ke, Montreal (CA); Zhu Fang, Montreal (CA)

(73) Assignee: POLYVALOR LMITED PARTNERSHIP, Montreal (CA)

( * ) Notice: Subject to any disclaimer, the term of this patent is extended or adjusted under 35 U.S.C. 154(b) by 449 days.

(21) Appl. No.: 17/285,299

(22) PCT Filed: Oct. 15, 2019

(86) PCT No.: PCT/CA2019/051460
§ 371 (c)(1),
(2) Date: Apr. 14, 2021

(87) PCT Pub. No.: WO2020/077447
PCT Pub. Date: Apr. 23, 2020

(65) Prior Publication Data
US 2021/0351514 A1 Nov. 11, 2021

Related U.S. Application Data

(60) Provisional application No. 62/745,530, filed on Oct. 15, 2018.

(51) Int. Cl.
*H01Q 13/18* (2006.01)
*H03F 3/19* (2006.01)

(52) U.S. Cl.
CPC .............. *H01Q 13/18* (2013.01); *H03F 3/19* (2013.01); *H03F 2200/451* (2013.01)

(58) Field of Classification Search
CPC .... H01Q 13/18; H01Q 9/0485; H01Q 13/106; H01Q 1/38; H03F 3/19; H03F 2200/451
See application file for complete search history.

(56) References Cited

U.S. PATENT DOCUMENTS

2017/0033464 A1* 2/2017 Henry ................ H01Q 21/28

OTHER PUBLICATIONS

Garcia-Lampéerz al., Compact Diplexer with Edge-Coupled and Nonbianisotropic Split-Ring Resonators, 2012 IEEE/MTTS International Microwave Symposium Digest, Jun. 17-22, 20212 Transactions on Smart Grid, vol. 5, No. 4, pp. 1905-1919, Jul. 2014.

(Continued)

*Primary Examiner* — David E Lotter
(74) *Attorney, Agent, or Firm* — NORTON ROSE FULBRIGHT CANADA LLP

(57) ABSTRACT

Herein provided is a resonator-diplexer-antenna (RDA) structure, active radiator, and associated systems and methods. The RDA structure comprises an input port configured for obtaining an input signal; an outer band defining an outer perimeter and an inner perimeter, the input port coupled to the outer band at a first point thereof, the outer band being configured to accept the input signal from the input port; and a core structure contained and retained within the inner perimeter of the outer band; wherein the core structure and the outer band define at least one gap between the core structure and the outer band; and the outer band, core structure, and at least one gap are configured to resonate at a predetermined frequency; and an output port coupled to the outer band at the second point and configured for outputting an output signal.

20 Claims, 10 Drawing Sheets

(56) References Cited

OTHER PUBLICATIONS

Omar, Amjad A. et al., Design and Synthesis of Microwave Coupled Resonator Deplexers, 11th IEEE Mediterranean Electrotechnical Conference (IEE Cat. No. 02CH37379), pp. 376-379, May 7-9, 2002.

Khan, Arani Ali and Mandal, Mrinal Kanti,Design of planar diplexers with improved isolation using the tunable transmission zeros of a dual-mode cavity filter, IET Microwaves, Antennas & Propagation, vol. II, Issue 11, pp. 1587-1593, Sep. 21, 2017.

T. Baras and A. F. Jacob, "Vertically integrated voltage-controlled oscillator in LTCC at K-Band," in 2008 IEEE MTT-S Int. Microw. Symp. (IMS2008), Atlanta, GA, 2008, pp. 359-362.

H. Lee, K. C. Yoon, B. W. Jeon, Y. W. Kim, H. Nam, and J. C. Lee, "Design of a new K-band push-push oscillator using miniaturized hairpin resonator," in 2009 Asia Pacific Microw. Con/., Singapore, 2009, pp. 1675-1678.

W. T. Khan, S. Bhattacharya, S. Horst, J. D. Cresslor, and J. Papapolymerou, "Low phase noise K-Band oscillator on organic liquid crystal polymer (LCP) substrate," in 2010 IEEE MTT-S Int. Microw. Symp. (IMS2010), Anaheim, CA, 2010, pp. 1186-1189.

A. Georgiadis, S. Via, A. Collado, and F. Mira, "Push-push oscillator design based on a substrate integrated waveguide (SIW) resonator," in 2009 Eur. Microw. Con/., Rome, France, 2009, pp. 1231-1234.

Z. Chen, W. Hong, J. Chen, and L. Li, "Design of a push-push and push-pull oscillator based on SIW/SICL technique," IEEE Microw. Compon. Lett., vol. 24, No. 6, pp. 397-399, Jun. 2014.

C. H. Mueller, R. Q. Lee, R. R. Romanofsky, C. L. Kory, K. M. Lambert, F. W. Van Keuls, and F. A. Miranda, "Small-size X-band active integrated antenna with feedback loop," IEEE Trans. Antennas Propag., vol. 56, No. 5, pp. 1236-1241, May 2008.

Y. J. Chen and T. S. Chu, "2-D direct-coupled standing-wave oscillator arrays," IEEE Trans. Microw. Theory Tech., vol. 61, No. 12, pp. 4472-4482, Dec. 2013.

R. K. Mongia and P. Bhartia, "Dielectric resonator antennas—A review and general design relations for resonant frequency and bandwidth," Int. J. Microw. Millim.-Wave Comput.-AidedEng, vol. 4, No. 3, pp. 230-247, 1994.

D. M. Pozar, Microwave Engineering, 3rd ed. New York, USA: Wiley, 2005, pp. 284.

A. Horn, "Dielectric constant and loss of selected grades of Rogers high frequency circuit substrates from 1-50 GHz," Rogers Corp., Rogers, CT, USA, Tech. Rep. 5786, Sep. 19, 2003.

F. Parment, A. Ghiotto, T. P. Vuong, J. M. Duchamp, and K. Wu, "Air-filled substrate integrated waveguide for low loss and high power handling millimeter-wave substrate integrated circuits," IEEE Trans. Microw. Theory Tech., vol. 63, No. 4, pp. 1228-1238, Apr. 2015.

A. Strobel, C. Carlowitz, R. Wolf, F. Ellinger and M. Vossiek, "A Millimeter-Wave Low-Power Active Backscatter Tag for FMCW Radar Systems," IEEE Trans. Microw. Theory Tech., vol. 61, No. 5, pp. 1964-1972, May 2013.

C. Carlowitz, M. Vossiek, A. Strobel and F. Ellinger, "Precise ranging and simultaneous high speed data transfer using mm-wave regenerative active backscatter tags," in 2012 IEEE Int. Con/. RFID, Penang, 2013, pp. 253-260.

S. Wehrli, R. Gierlich, J. Huttner, D. Barras, F. Ellinger and H. Jackel, "Integrated Active Pulsed Reflector for an Indoor Local Positioning System," IEEE Trans. Microw. Theory Tech., vol. 58, No. 2, pp. 267-276, Feb. 2010.

M. Vossiek and P. Gulden, "The Switched Injection-Locked Oscillator: A Novel Versatile Concept for Wireless Transponder and Localization Systems," IEEE Trans. Microw. Theory Tech., vol. 56, No. 4, pp. 859-866, Apr. 2008.

R. Gierlich, J. Huettner, A. Ziroff, R. Weigel and M. Huemer, "A Reconfigurable MIMO System for High-Precision FMCW Local Positioning," IEEE Trans. Microw. Theory Tech., vol. 59, No. 12, pp. 3228-3238, Dec. 2011.

J. Lorenzo, A. Lazaro, R. Villarino and D. Girbau, "Active Backscatter Transponder for FMCW Radar Applications," IEEEAntenn. Wireless Propag. Lett., vol. 14, pp. 1610-1613,2015.

F. K. Wang, C. H. Fang, T. S. Horng, K. C. Peng, J. Y. Li and C. C. Chen, "Concurrent Vital Sign and Position Sensing of Multiple Individuals Using Self-Injection-Locked Tags and Injection-Locked I/Q Receivers with Arctangent Demodulation," IEEE Trans. Microw. Theory Tech., vol. 61, No. 12. pp. 4689-4699, Dec. 2013.

M. Vossiek, R. Roskosch and P. Heide, "Precise 3-D Object Position Tracking using FMCW Radar," in 1999 29th Eur. Microw. Con/, Munich, Germany, 1999, pp. 234-237.

L. Han and K. Wu, "24-GHz Integrated Radio and Radar System Capable of Time-Agile Wireless Communication and Sensing," IEEE Trans. Microw. Theory Tech., vol. 60, No. 3, pp. 619-631, Mar. 2012.

S. Ayhan, S. Scherr, A. Bhutani, B. Fischbach, M. Pauli and T. Zwick, "Impact of Frequency Ramp Nonlinearity, Phase Noise, and SNR on FMCW Radar Accuracy," IEEE Trans. Microw. Theory Tech., vol. 64, No. 10, pp. 3290-3301, Oct. 2016.

A. Stelzer, K. Pourvoyeur and A. Fischer, "Concept and application of LPM—a novel 3-D local position measurement system," IEEE Trans. Microw. Theorv Tech., vol. 52, No. 12, pp. 2664-2669, Dec. 2004.

A. G. Stove, "Linear FMCW radar techniques," IEE Proc. F-Radar Signal Process., vol. 139, No. 5, pp. 343-350, Oct. 1992.

N. Iliev and I. Paprotny, "Review and Comparison of Spatial Localization Methods for Low-Power Wireless Sensor Networks," IEEE Sens. J., vol. 15, No. 10, pp. 5971-5987, Oct. 2015.

M. Vossiek, L. Wiebking, P. Gulden, J. Wieghardt, C. Hoffmann and P. Heide, "Wireless local positioning," IEEE Microw. Mag, vol. 4, No. 4, pp. 77-86, Dec. 2003.

H. Celebi, I. GUven?, S. Gezici and H. Arslan, "Cognitive-Radio Systems for Spectrum, Location, and Environmental Awareness," IEEE Antennas Propag. Mag, vol. 52, No. 4, pp. 41-61, Aug. 2010.

R. Di Taranto, S. Muppirisetty, R. Raulefs, D. Slock, T. Svensson and H. Wymeersch, "Location-Aware Communications for 5G Networks: How location information can improve scalability, latency, and robustness of 5G," IEEE Signal Process. Mag., vol. 31, No. 6, pp. 102-112, Nov. 2014.

G. Ding, J. Wang, Q. Wu, F. Song and Y. Chen, "Spectrum Sensing in Opportunity-Heterogeneous Cognitive Sensor Networks: How to Cooperate?," IEEE Sens. J., vol. 13, No. 11, pp. 4247-4255, Nov. 2013.

K. Witrisal, S. Hinteregger, J. Kulmer, E. Leitinger and P. Meissner, "High-accuracy positioning for indoor applications: RFID, UWB, 5G, and beyond," in 2016 IEEE Int. Con/. RFID, Orlando, FL, 2016, pp. 1-7.

F. Kirsch, R. Mlescn and M. Vossiek, "Precise local-positioning for autonomous situation awareness in the Internet of Things," in 2014 IEEE MTT-S Int. Microw. Symp. (IMS2014), Tampa, FL, 2014, pp. 1-4.

K. Wang, A. Ghiotto, and K. Wu, "Harmonic feedback-loop oscillator for pulling effect reduction and improved phase noise," in 2014 IEEE MTTS Int. Microw. Symp. (IMS2014), Tampa. FL, 2014, pp. 1-4.

B. Razavi, "A study of injection locking and pulling in oscillators," IEEE J. Solid-State Circuit, vol. 39, No. 9, pp. 1415-1424, Sep. 2004.

J. Obregon and A.P.S. IGianna, "Exact derivation of the nonlinear negative-resistance oscillator pulling figure," IEEE Trans. Microw. Theory Tech., vol. 30, No. 7, pp. 1109-1111, Jul. 1982.

P. Nazari, S. Jafariou, and P. Heydari, "A fundamental-frequency 114GHz circular-polarized radiating element with 14dBm EIRP, -99.3dBc/Hz phase-noise at 1 MHz offset and 3.7% peak efficiency," in 2017 IEEE Int. Solid-State Circuits Con/., San Francisco, CA, 2017, pp. 322-323.

K. Sengupta and A. Hajimiri, "Designing optimal surface currents for efficient on-chip mm-wave radiators with active circuitry," IEEE Trans. Microw. Theory Tech., vol. 64, No. 7, pp. 1976-1988, Jul. 2016.

(56) References Cited

OTHER PUBLICATIONS

K. Sengupta and A. Hajimiri, "A 0.28 THz power-generation and beam-steering array in CMOS based on distributed active radiators," IEEE J. Solid-State Circuit, vol. 47, No. 12, pp. 3013-3031, Dec. 2012.
K. Sengupta and A. Hajimiri, "Distributed active radiation for THz signal generation," in 2011 IEEE Int. Solid-State Circuits Con/., San Francisco, CA, 2011, pp. 288-289.
P. Liao and R. A. York, "A new phase-shifterless beam-scanning technique using arrays of coupled oscillators," IEEE Trans. Microw. Theory Tech., vol. 41, No. 10, pp. 1810-1815, Oct. 1993.
E. H. Lim and K. W. Leung, "Novel utilization of the dielectric resonator antenna as an oscillator load," IEEE Trans. Antennas Propag, vol. 55, No. 10, pp. 2686-2691, Oct. 2007.
C. H. Wu and T. G. Ma, "Pattern-reconfigurable self-oscillating active integrated antenna with frequency agility," IEEE Trans. Antennas Propag, vol. 62, No. 12, pp. 5992-5999, Dec. 2014.
C. H. Wu and T. G. Ma, "Self-oscillating semi-ring active integrated antenna with frequency reconfigurability and voltage-controllability," IEEE Trans. Antennas Propag, vol. 61, No. 7, pp. 3880-3885, Jul. 2013.
Y. Y. Lin and T. G. Ma, "Frequency-reconfigurable self-oscillating active antenna with gap-loaded ring radiator," IEEE Antennas Wireless Propag. Lett., vol. 12, No., pp. 337-340, Mar. 2013.
F. Giuppi, A. Georgiadis, A. Collado, and M. Bozzi, "A compact, single-layer substrate integrated waveguide (SIW) cavity-backed active antenna oscillator," IEEE Antennas Wireless Propag. Lett., vol. 11, No., pp. 431-433, Apr. 2012.
K. Chang, R. A. York, P. S. Hall, and T. Itoh, "Active integrated antennas," IEEE Trans. Microw. Theory Tech., vol. 50, No. 3, pp. 937-944, Mar. 2002.
P. Burasa, N. G. Constantin, and K. Wu, "Low-power injection-locked zero-IF self-oscillating mixer for high Gbit/s data-rate battery-free active //RFID tag at millimeter-wave frequencies in 65-nm CMOS," IEEE Trans. Microw. Theory Tech., vol. 64, No. 4, pp. 1055-1065, Apr. 2016.
C. E. Saavedra, B. R. Jackson, and S. S. K. Ho, "Self-oscillating mixers: A natural fit for active antennas," IEEE Microw. Mag., vol. 14, No. 6, pp. 40-49, Sep.-Oct. 2013.
A. J. Martinez-Ros, J. L. Gdmez-Tornero, and G. Goussetis, "Multifunctional angular bandpass filter SIW leaky-wave antenna," IEEE Antennas Wireless Propag. Lett., vol. 16, No., pp. 936-939, Oct. 2016.
P. Burasa, T. Djerafi, N. G. Constantin, and K. Wu, "High-data-rate single-chip battery-free active millimeter-wave Identification tag in 65-nm CMOS technology," IEEE Trans. Microw. Theory Tech., vol. 64, No. 7, pp. 2294-2303, Jul. 2016.
O. A. Nova, J. C. Bohorquez, N. M. Pena, G. E. Bridges, L. Shafai, and C. Shafai, "Filter-antenna module using substrate integrated waveguide cavities," IEEE Antennas Wireless Propag. Lett., vol. 10, No., pp. 59-62, Jan. 2011.
G. Q. Luo, W. Hong, H. J. Tang, J. X. Chen, X. X. Yin, Z. Q. Kuai, and K. Wu, "Filtenna consisting of hom antenna and substrate integrated waveguide cavity FSS," IEEE Trans. Antennas Propag, vol. 55, No. 1, pp. 92-98, Jan. 2007.
Y. J. Cho, K. H. Kim, D. H. Choi, S. S. Lee, and S. O. Park, "A miniature UWB planar monopole antenna with 5-GHz band-rejection filter and the time-domain characteristics," IEEE Trans. Antennas Propag., vol. 54, No. 5, pp. 1453-1460, May 2006.
B. Goettel, P. Pahl, C. Kutschker, S. Malz, U. R. Pfeiffer, and T. Zwick, "Active multiple feed on-chip antennas with efficient in-antenna power combining operating at 200-320 GHz," IEEE Trans. Antennas Propag., vol. 65, No. 2, pp. 416-423, Feb. 2017.
A. Dierck, H. Rogier, and F. Declercq, "A wearable active antenna for global positioning system and satellite phone," IEEE Trans. Antennas Propag., vol. 61, No. 2, pp. 532-538, Feb. 2013.
M. Bozzi, A. Georgiadis, and K. Wu, "Review of substrate-integrated waveguide circuits and antennas," IET Microw. Antennas Propag., vol. 5, No. 8, pp. 909-920, Jun. 2011.
W. R. Deal, N. Kaneda, J. Sor, Y. Qian, and T. Itoh, "A new quasi-Yagi antenna for planar active antenna arrays," IEEE Trans. Microw. Theory Tech., vol. 48, No. 6, pp. 910-918, Jun. 2000.
R. Kananizadeh and O. Momeni, "High-power and high-efficiency millimeter-wave harmonic oscillator design, exploiting harmonic positive feedback in CMOS," IEEE Trans. Microw. Theory Tech., vol. PP, No. 99, pp. 1-15.
Z. Zong, M. Babaie, and R. B. Staszewski, "A 60 GHz frequency generator based on a 20 GHz oscillator and an implicit multiplier," IEEE J. Solid-State Circuit, vol. 51, No. 5, pp. 1261-1273, May 2016.
J. Grzyb, Y. Zhao, and U. R. Pfeiffer, "A 288-GMz lens-integrated balanced triple-push source in a 65-nm CMOS technology," IEEEJ. Solid-State Circuit, vol. 48, No. 7, pp. 1751-1761, Jul. 2013.
F. II. Huang, C. K. Lin, and Y. J. Chan, "V-band GaAs pHEMT cross-coupled sub-harmonic oscillator," IEEE Microw. Compon. Lett., vol. 16, No. 8, pp. 473-475, Aug. 2006.
T. Djurhuus, V. Krozer, J. Vidkjaer, and T. K. Johansen, "Nonlinear analysis of a cross-coupled quadrature harmonic oscillator," IEEE Trans. Circuits Syst. I, Reg. Papers, vol. 52, No. 11, pp. 2276-2285, Nov. 2005.
J. Stake, A. Malko, T. Bryllert, and J. Vukusic, "Status and prospects of high-power heterostructure barrier varactor frequency multipliers," Proc. IEEE, vol. 105, No. 6, pp. 1008-1019, Jun. 2017.
A. Maestrini, J. S. Ward, J. J. Gill, C. Lee, B. Thomas, R. H. Lin, G. Chattopadhyay, and I. Mehdi, "A frequency-multiplied source with more than 1 mW of power across the 840 900-GHz band," IEEE Trans. Microw. Theory Tech., vol. 58, No. 7, pp. 1925-1932, Jul. 2010.
W. Li and J. Yao, "Investigation of photonically assisted microwave frequency multiplication based on external modulation," IEEE Trans. Microw. Theory Tech., vol. 58, No. 11, pp. 3259-3268, Nov. 2010.
G. Chattopadhyay, E. Schlecht, J. S. Ward, J. J. Gill, H. H. S. Javadi, F. Maiwald, and I. Mehdi, "An all-solid-state broad-band frequency multiplier chain at 1500 GHz," IEEE Trans. Microw. Theory Tech., vol. 52, No. 5, pp. 1538-1547, May 2004.
"Report and order and further notice of proposed rulemaking," Federal Communications Commission, Washington, D. C., USA, Rep. & Ord. FCC 16-89, Jul. 14, 2016.
K. Wang, J. F. Gu, F. Ren, and K. Wu, "A multitarget active backscattering 2-D positioning system with superresolution time series post-processing technique," IEEE Trans. Microw. Theory Tech., vol. 65, No. 5, pp. 1751-1766, May 2017.
K. Wu, P. Burasa, T. Djerafi, and N. G. Constantin, "Millimeter-wave identification for future sensing, tracking, positioning and communicating systems," in 2016 GlobalSymp. Millim. Waves (GSMM) & ESA Workshop onMillim.—Wave Tech. Appl., Espoo, Finland, 2016, pp. 1-4.

* cited by examiner

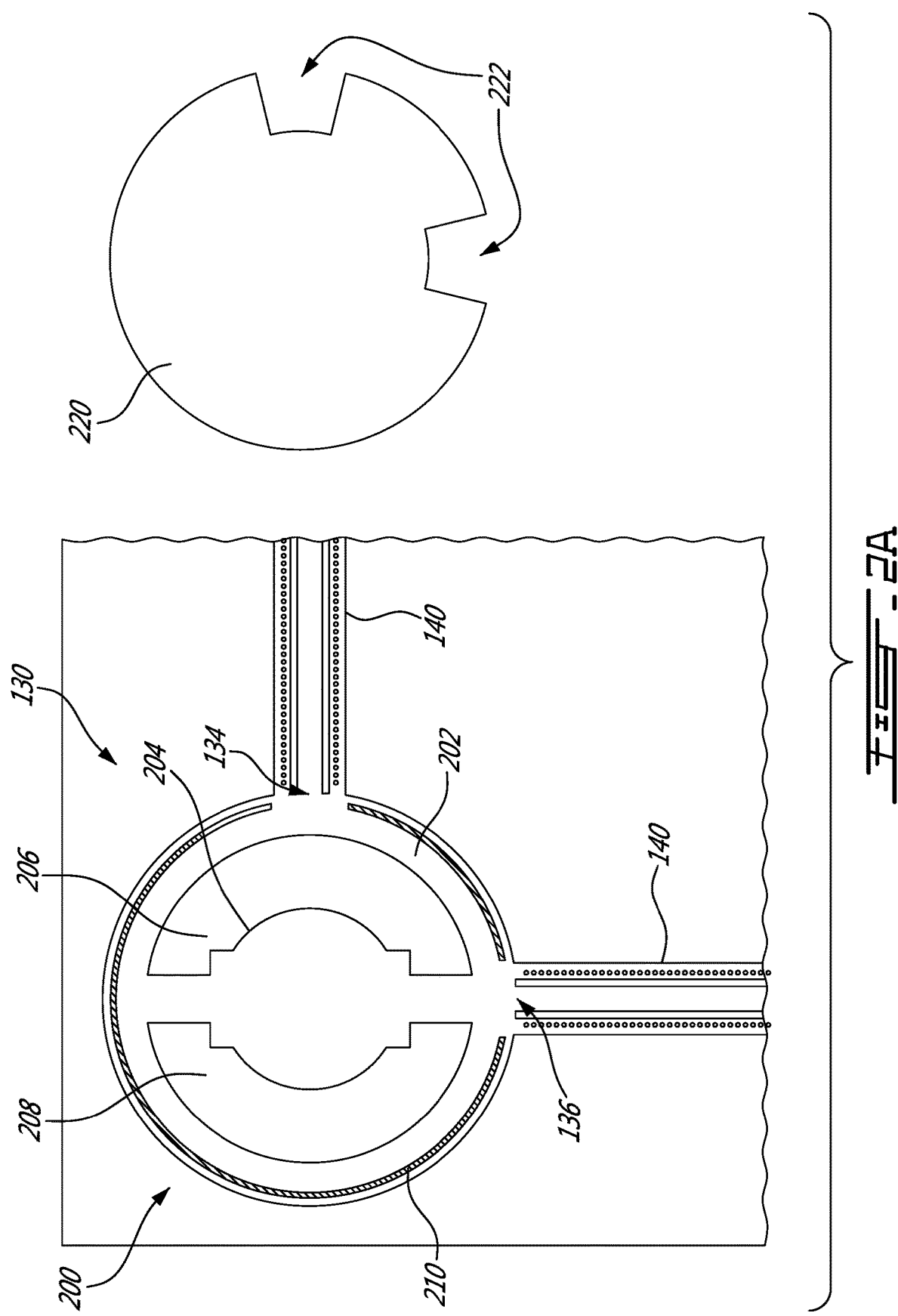

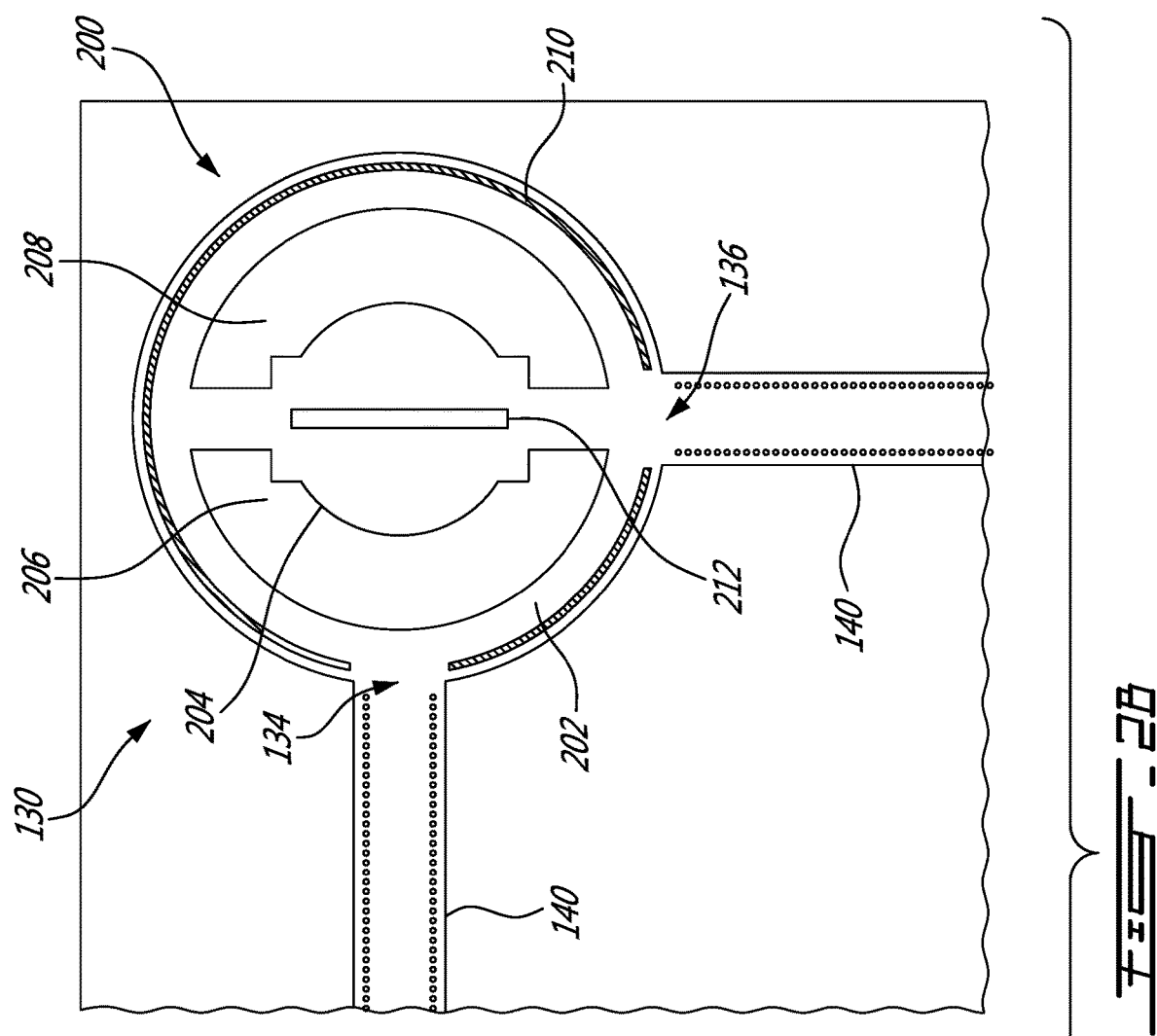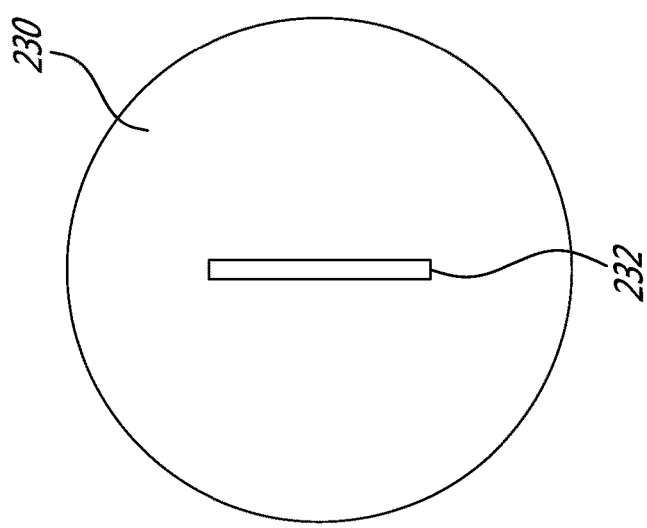
FIG. 2B

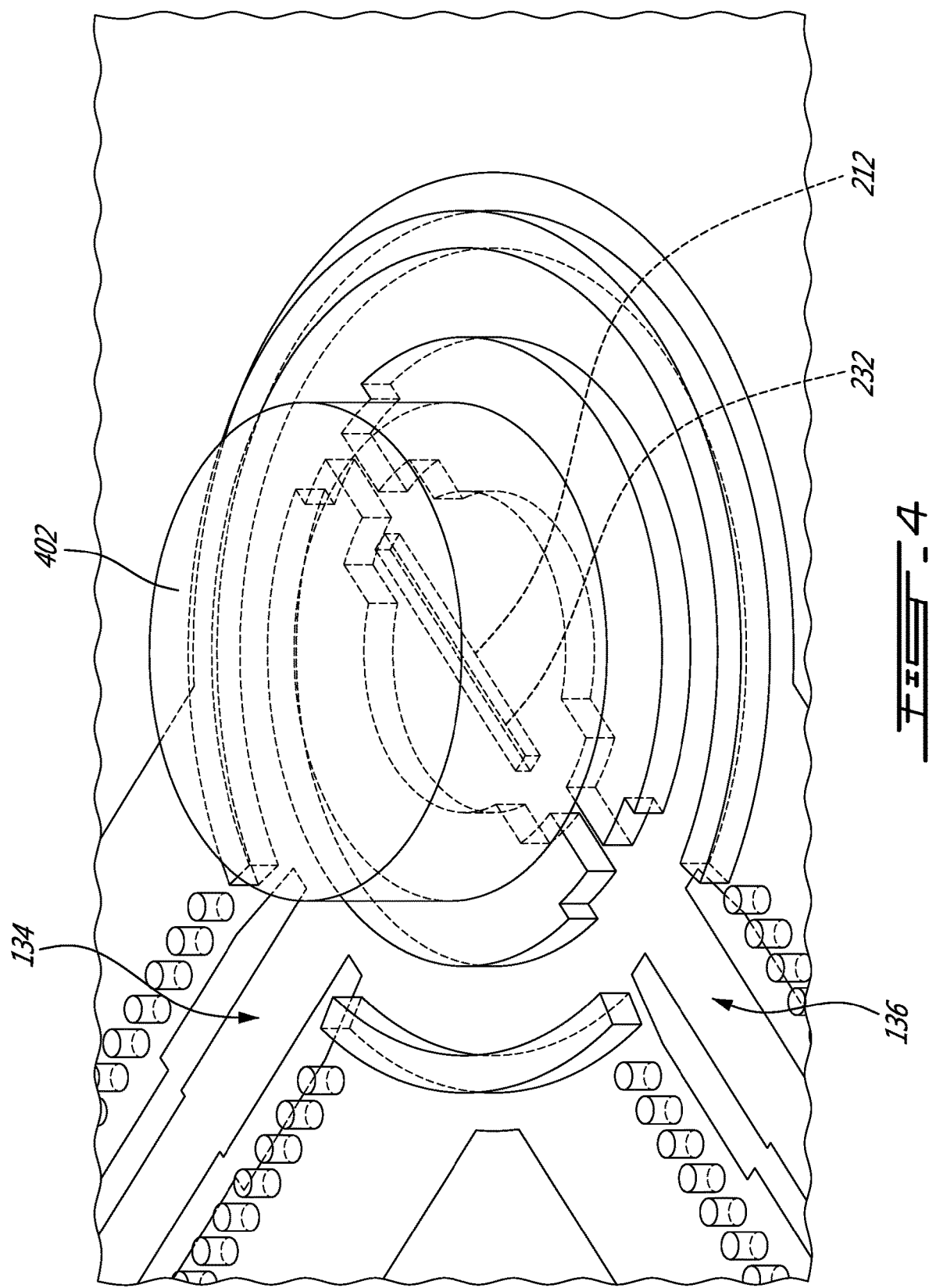

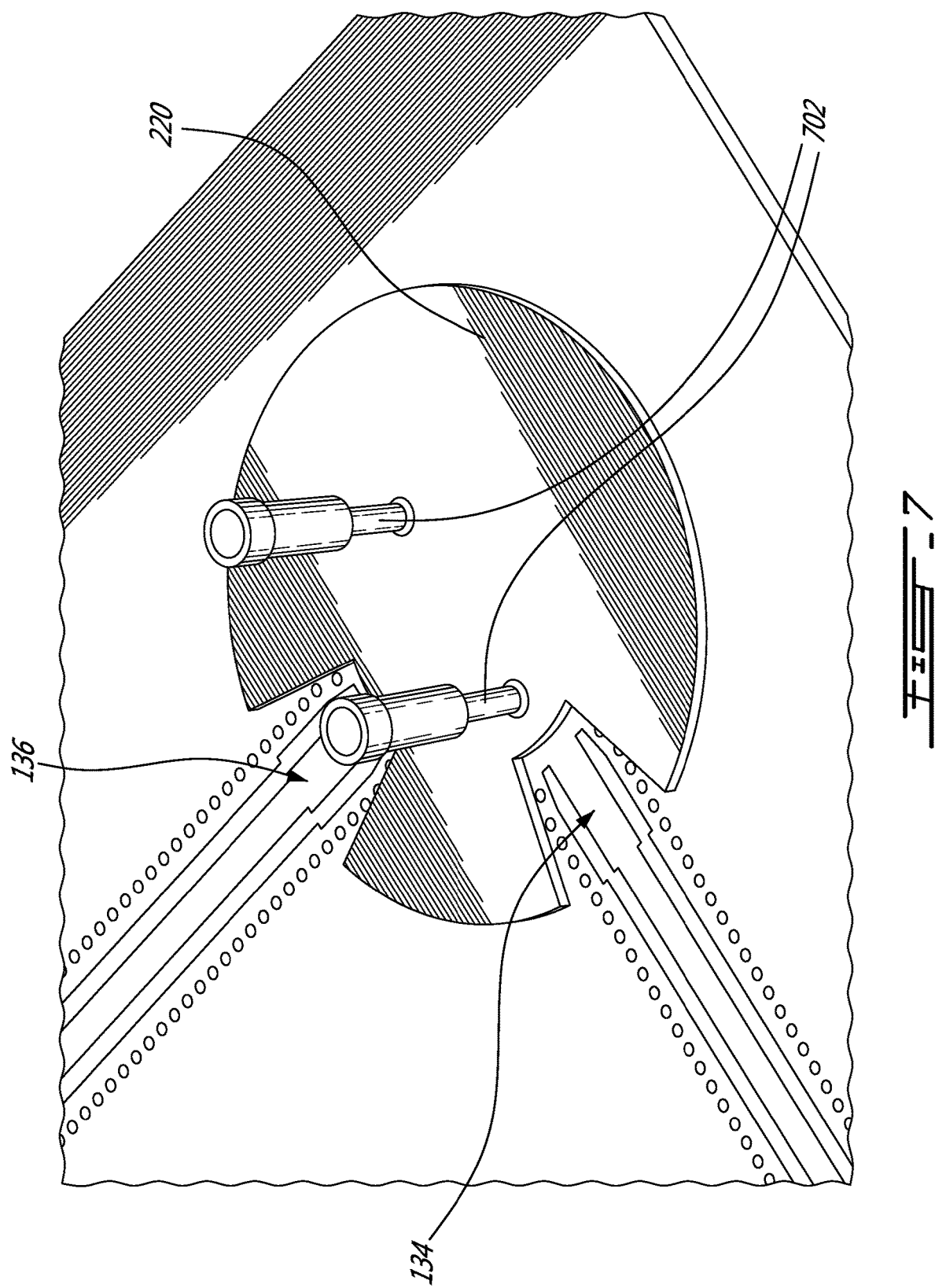

RESONATOR-DIPLEXER-ANTENNA

CROSS REFERENCE TO RELATED APPLICATIONS

This patent application claims priority of U.S. provisional Application Ser. No. 62/745,530, filed on Oct. 15, 2018, the entire contents of which are hereby incorporated by reference.

TECHNICAL FIELD

The present disclosure relates generally to electromagnetic wave transceivers, and more particularly to active radiators.

BACKGROUND

Electromagnetic waves have long been used as a medium for transmitting information over long distances. In some cases, to generate the electromagnetic waves, a device known as an oscillator can be used. The oscillator is then connected to an antenna, which is used to transmit the electromagnetic waves. The operation of the oscillator can be modulated by signals carrying information such that the combination of the oscillator and the antenna is regarded as a transmitter of communication. A typical way of modulation is switching the oscillator on and off, in accordance with an information signal. Modern technology has assisted in the miniaturization of such transmitters and has also led to higher values for transmission frequency. For instance, millimeter- and terahertz-wave transmitters are becoming increasingly popular for use in applications such as identification, ranging, imaging, and general communication. It should be noted that millimeter- and terahertz-wave transmissions typically occur at frequencies ranging between 30 GHz and 30 THz.

However, the coupling of the antenna to the oscillator results in certain drawbacks. Traditional designs require significant amounts of space to accommodate the radiator structure of the antenna, the oscillator circuitry, and the connecting structure in between. In addition, the connection can result in losses of electromagnetic wave energy and efficiency, which is more significant as the frequency of design is higher. Moreover, the direct coupling of the antenna to the oscillator results in a large pulling effect. This means that the output frequency and power from the antenna can change due to the presence of a foreign object in proximity to the antenna, or due to other electrostatic signals arising in the surrounding environment. A strong pulling effect may even interrupt the operation of the oscillator. Typically, additional circuit blocks need to be added to mitigate the pulling effect, resulting in additional expense.

To implement transmitters which radiate electromagnetic waves from an oscillator, there is a need for improved designs.

SUMMARY

In accordance with a broad aspect, there is provided a resonator-diplexer-antenna (RDA) structure, comprising: an input port configured for obtaining an input signal; an outer band defining an outer perimeter and an inner perimeter, the input port coupled to the outer band at a first point thereof, the outer band being configured to accept the input signal from the input port; a core structure contained and retained within the inner perimeter of the outer band; wherein the core structure and the outer band defining at least one gap between the core structure and the outer band; and the outer band, core structure, and at least one gap are configured to resonate at a predetermined frequency; and an output port coupled to the outer band at the second point and configured for outputting an output signal.

In some embodiments, the input signal comprises m components at m frequencies $f_1, f_2, \ldots f_m$, and wherein the output signal comprises n components at n frequencies $f_1, f_2, \ldots f_n$, wherein the n frequencies are a subset of the m frequencies.

In some embodiments, the predetermined frequency is different from a frequency of the output signal.

In some embodiments, the frequency of the output signal is a harmonic frequency of the predetermined frequency.

In some embodiments, the core structure is formed integrally with the outer band.

In some embodiments, the core structure is formed separately from the outer band and coupled thereto.

In some embodiments, the RDA structure further comprises a dielectric material positioned in at least a portion of the at least one gap between the core structure and the outer band.

In some embodiments, the dielectric material comprises a portion of a substrate on which the outer band is formed.

In some embodiments, the at least one gap between the core structure and the outer band is at least one air gap.

In some embodiments, the RDA structure further comprises at least one cover coupled to a substrate on which the outer band is formed and positioned to encompass at least part of the outer band and the core structure.

In some embodiments, the at least one cover comprises a bottom cover coupled to a bottom surface of the substrate, the bottom cover defining a cover slit which substantially aligns with a slit defined in the core structure.

In some embodiments, the at least one cover comprises a top cover coupled to a top surface of the substrate, the top cover defining at least one opening, the structure further comprising at least one tuning pin inserted in the at least one opening to adjust a resonance of the at least one gap.

In some embodiments, the core structure has defined therein a slit for blocking an undesirable signal forming part of the input signal.

In some embodiments, the RDA structure further comprises a dielectric resonator affixed to at least part of the core structure and/or at least part of the outer band.

In some embodiments, the RDA structure further comprises an amplifier, the amplifier configured for receiving the output signal and producing the input signal.

In accordance with at least one other broad aspect, there is provided an active radiator system. The active radiator system comprises an amplifier, and an RDA structure as defined hereinabove and coupled to the amplifier. The input port of the RDA structure is coupled to an output port of the amplifier, and wherein the output port of the RDA structure is coupled to an input port of the amplifier.

In some embodiments, the amplifier is configured for receiving the output signal and producing the input signal based on the output signal In some embodiments, the amplifier is further configured for producing the input signal based on a length of connectors coupling the amplifier and the RDA structure.

In some embodiments, the RDA structure is coupled to the amplifier via substrate-integrated waveguides.

In accordance with at least one further broad aspect, there is provided a method for producing a resonator-diplexer-antenna (RDA) structure. The method comprises: estimating, for a given substrate material, a cavity radius for a first resonant mode; selecting, based on the estimated cavity radius, an outer radius and a radiation slot length; selecting, based on the outer radius and the radiation slot length, an inner radius; and producing the RDA structure having dimensions based on the cavity radius, the outer radius, the inner radius, and the radiation slot length.

In some embodiments, the method further comprises: performing a simulation of a virtual RDA structure based on the cavity radius, the outer radius, the inner radius, and the radiation slot length; and adjusting at least one of the cavity radius, the outer radius, the inner radius, and the radiation slot length based on the simulation.

Any of the above features may be used alone, together in any suitable combination, and/or in a variety of arrangements, as appropriate.

BRIEF DESCRIPTION OF THE DRAWINGS

The invention will be described in greater detail with reference to the accompanying drawings, in which:

FIGS. 2A-B are top and bottom views of an example resonator-diplexer-antenna (RDA) structure, in accordance with an embodiment;

FIG. 4 is a perspective view of an example dielectric resonator affixed to the RDA structure of FIGS. 2A-B;

FIG. 7 is a front perspective view of the embodiment of the RDA structure of FIGS. 6A-B with tuning pins.

DETAILED DESCRIPTION

Figure 1:
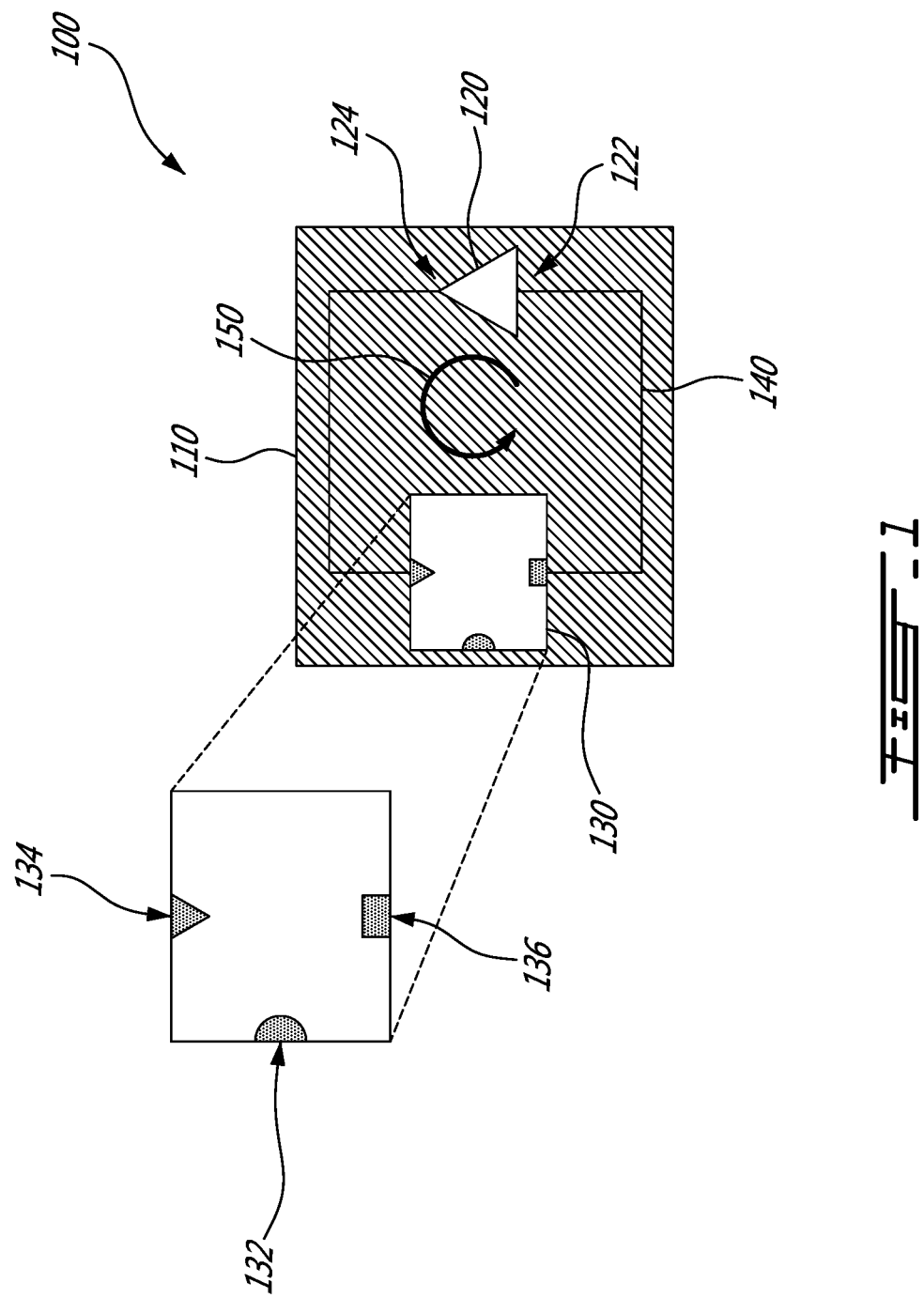
FIG. 1 is a circuit diagram of an example active radiator system.

With reference to FIG. 1, there is shown a circuit diagram of an example active radiator system 100. The active radiator system 100 is shown as being implemented on a substrate 110, though it should be noted that other implementations are also considered. The substrate may be any suitable type of substrate, and may be composed of one or more layers of dielectric material and two (or more) layers of conductive material, which can be interleaved with the layers of dielectric material. For example, the dielectric material can be one of polytetrafluoroethylene (PTFE), ceramic, glass, silicon oxide ($SiO_2$), gallium arsenide (GaAs), or any suitable combination thereof. For example, the conductive material can be one of copper, gold, aluminium, silver, and the like, and/or any suitable alloy thereof.

Disposed on the substrate 110 are an amplifier 120 and a diplexer 130. The amplifier can be a low noise amplifier (LNA), a power amplifier, a transistor-based amplifier, or any other suitable amplifier, or any suitable combination thereof. The amplifier 120 has an input 122 and an output 124, both of which are coupled to the diplexer 130. Electromagnetic wave energy thus flows between the amplifier 120 and the diplexer 130 in a loop 140, substantially following the direction shown by arrow 150.

The diplexer 130 can have a plurality of ports 132, 134, 136, which can serve different purposes depending on design choices. As will be described in greater detail hereinbelow, the port 134 is selected to act as a common port, and the port 136 as a low-frequency port. The output 124 of the amplifier 120 is coupled to the common port 134 of the diplexer 130, and the low-frequency port 136 of the diplexer 130 is coupled to the input of the amplifier 120, as illustrated in FIG. 1. In some embodiments, part or all of the loop 140 is implemented using microstrip line, coplanar waveguide, substrate-integrated waveguides (SIW) or other electromagnetic wave transfer structure. In some cases, SIW exhibits characteristics including low loss, self-shielding, low profile, and reduced cost.

In operation, the coupling of loop 140, diplexer 130 and amplifier 120 oscillates at a frequency $f_0$, referred to as the fundamental frequency; that is to say, the coupled three parts operate synergistically to continuously produce an electromagnetic signal at the fundamental frequency $f_0$. This signal can be produced by the amplifier 120 at the output 124, input to the common port 134, and output via the low-frequency port 136 toward the input 122 of the amplifier 120, which in turn amplifies the signal at h, provided the signal travels an appropriate length. The fundamental frequency $f_0$ can be any suitable frequency, and in some examples is selected such that one or more particular harmonics of the fundamental frequency $f_0$ are in the millimeter- and terahertz-wave band, that is to say substantially between 30 GHz and 30 THz. For instance, the fundamental frequency $f_0$ can be selected such that the second harmonic of the fundamental frequency $f_0$, namely $2f_0$, is substantially within the range of 30 GHz to 30 THz. It should be noted that frequencies around the range of 30 GHz to 30 THz, including between 3 and 30 GHz, are also considered.

As the loop oscillates at the fundamental frequency $f_0$, nonlinearities in the amplifier 120 produce a secondary signal at the second harmonic frequency $2f_0$. Both the signal at h and the secondary signal at $2f_0$ are directed to the common port 134 of the diplexer 130. Although the foregoing discussion will focus on only two signals (one at $f_0$, the other at $2f_0$), it should be noted that in certain embodiments, the amplifier 120 may produce any number of signals. As will be described in greater detail hereinbelow, the common port 134 of the diplexer 130 can be configured to pass the signal at the fundamental frequency $f_0$ to the low-frequency port 136. In one embodiment, the port 132 obtains the secondary signal at $2f_0$ and is configured for radiating, i.e., transmitting the secondary signal at $2f_0$ to free space as an electromagnetic wave. The signal at the fundamental frequency $f_0$ can then be fed to the input 122 of the amplifier 120 via the low-frequency port 136.

With additional reference to FIG. 2A and FIG. 2B, there is shown an implementation of the diplexer 130 of the active radiator system 100. Specifically, FIG. 2A illustrates a top view of the diplexer 130, and FIG. 2B illustrates a bottom view of the diplexer 130. In some embodiments, the loop 140, which is extended from the common port 134 and the low-frequency port 136, is implemented using SIW technology, in which a resonator-diplexer-antenna (RDA) structure 200 is used to implement the diplexer 130. The RDA structure 200 is configured for causing the secondary signal at $2f_0$ to be transmitted as an electromagnetic wave to free space, and for passing the signal at the fundamental frequency $f_0$ to be routed to the input 122 of the amplifier 120. In one embodiment, the RDA structure 200 is composed of an outer band 202 and a core structure 204. The outer band 202 defines both inner and outer perimeters, such that the common and low-frequency ports 134, 136 are coupled to the outer perimeter of the outer band 202, and the core structure 204 is coupled to, or formed integrally with, the inner perimeter of the outer band 202. The core structure 204 can be shaped to have a central circular portion with two extending branches which contact the outer band 202 at the inner perimeter thereof, though other configurations are considered. In some embodiments, the coupling points between the core structure 204 and the outer band 202 are substantially opposite from one-another, and are each spaced from the point at which the common port 134 contacts the outer band 202 by roughly 90°. Other configurations are also considered. For instance, the core structure 204 may be coupled to another portion of the substrate, as appropriate.

Together, the outer band 202 and the core structure 204 define a pair of gaps 206, 208, and an outer slit 210 is defined substantially along the outer perimeter of the outer band 202. In some embodiments, the gaps 206, 208 are substantially devoid of material, and can be filled with air or the like. In other embodiments, as described in greater detail hereinbelow, the gaps 206, 208 are not empty, and instead formed of a particular material which may be different from that used to form the core structure 204 and/or the outer band 202. The outer slit 210 can be substantially continuous around the outer band 202, with breaks aligned at the common and low-frequency ports 134, 136. In some embodiments, the slit 210 conductively connects the top and bottom sides surfaces of the outer band 202, for instance via a conductive layer placed on an inner wall of the slit 210. The bottom side of the core structure 204 can be provided with a slit 212, as shown in FIG. 2B. The slit 212, as discussed in greater detail hereinbelow, acts as a slot antenna for radiating the secondary signal at $2f_0$ to free space as electromagnetic waves.

In addition, the RDA structure 200 can be provided with covers 220, 230, which can be affixed to the top and bottom sides of the substrate 110, respectively. In some embodiments, the covers 220, 230 are configured to provide substantially uniformly conductive surfaces along both the top and bottom sides surfaces of the substrate 110, within a region defined by the outer perimeter of the outer band 202, such that the slit 210, and the conductive surfaces connected thereby define a substantially closed compartment. In some instances, this configuration allows the RDA structure to support certain electromagnetic field resonant modes, as defined by the dimensions of the RDA structure. The covers 220, 230 can be of conductive material or any material with conductive coating. The covers 220, 230 can substantially entirely cover the outer band 202 and the core structure 204. In some embodiments, the cover 220, which is placed on the top side of the substrate 110, defines a pair of inlets 222 which are aligned with the SIWs defined in the substrate 110 and which form part of the loop 140. Additionally, or in the alternative, certain embodiments of the cover 230 define a slit 232, which can be defined in the cover 230 such that, when affixed to the substrate 110 and superimposed on the RDA structure 200, the slit 232 is substantially aligned and corresponding with the slit 212 in the RDA structure 200. In some embodiments, the slits 212 and 232 are also substantially of the same size.

Figure 3B:
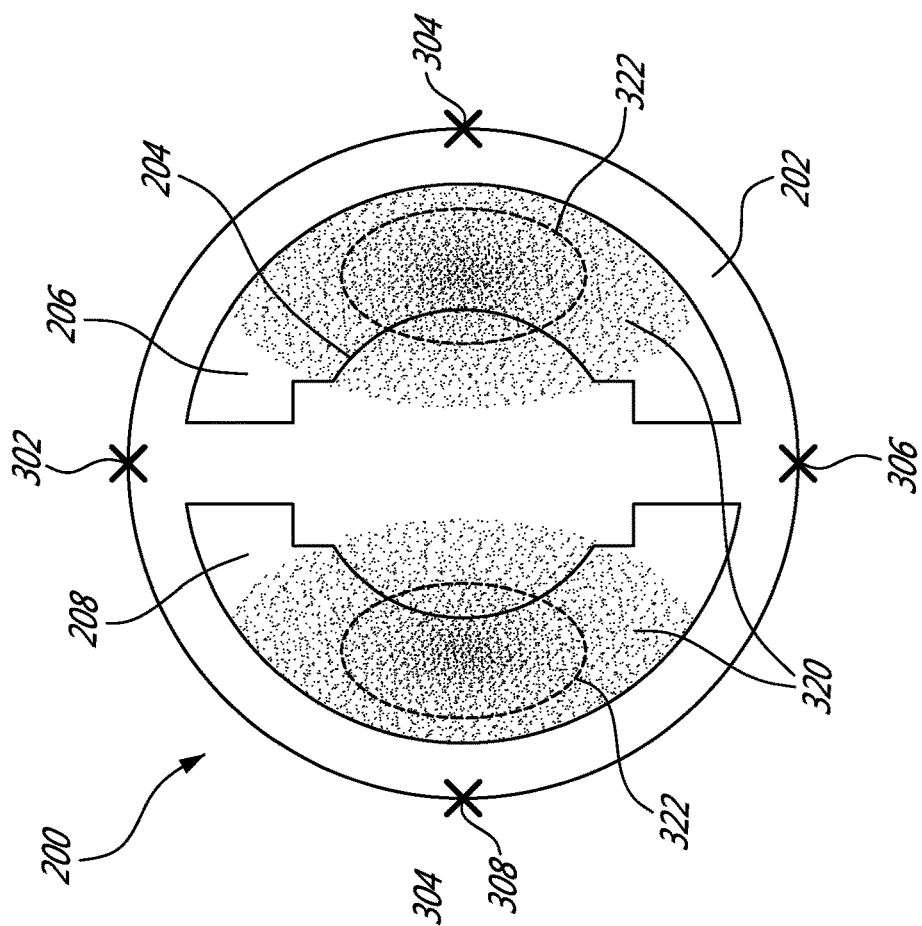
FIGS. 3A-B are block diagrams of example peak magnitudes of example periodic electric fields for two different resonant modes of the RDA structure of FIGS. 2A-B.
Figure 3A:
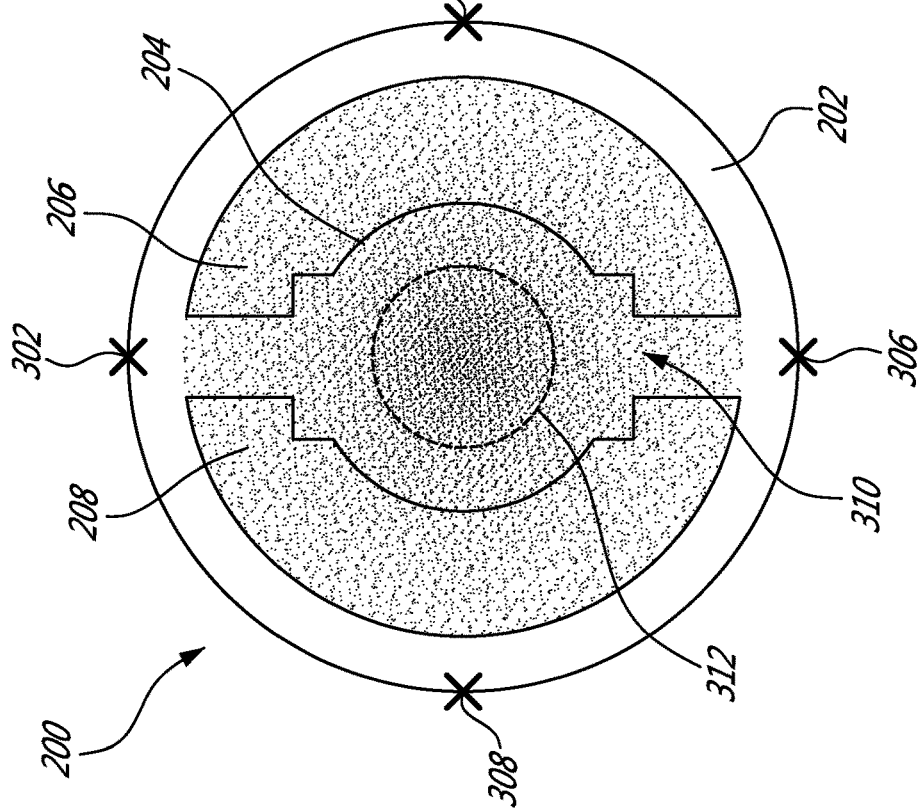

In order to illustrate the operation of the RDA structure 200, additional reference is made to FIG. 3A and FIG. 3B, in each of which is illustrated the peak magnitude of the periodic electric fields of a different mode of the RDA structure 200. In order for the RDA structure 200 to radiate the secondary signal at $2f_0$ yet pass the signal at the fundamental frequency $f_0$ between the common port 134 and the low frequency port 136, two different modes which have intrinsic frequencies that differ substantially by a factor of 2 are used. Evaluation of different modes for a circular SIW cavity, in this case defined by the RDA structure 200, reveals that modes $TM_{010}$ and $TM_{110}$ may be suitable, as the ratio of intrinsic frequencies of these modes is $f_{TM110}/f_{TM010}=1.59$. It should be noted that for a rectangular cavity, the relevant modes may be $TE_{201}$ and $TE_{101}$, and alternative designs of the RDA structure 200 defining a cavity with other shapes such as rectangular, ellipse, diamond and so on may also be considered.

When designing the RDA structure 200, the Q-factor for the $TM_{mn0}$ modes for the circular cavity can be evaluated. In some embodiments, the Q-factor can be expressed as $$Q = \left(\frac{1}{\tan\delta} + \frac{2R_s}{k\eta b} + \frac{4R_{s1}}{k\eta a}\right)^{-1} \quad (1)$$

in which $\tan\delta$ is the loss tangent of the dielectric material of a substrate, for instance the substrate 110, $R_s$ and $R_{s1}$ are the surface resistance of the conductive layer of the substrate 110 and the surface resistance of the conductive slit 210 on the substrate 110, respectively, and k and η are the wave number and the wave impedance of the dielectric media at the resonant frequency, respectively, and in which a and b are the parameter of dimensions of the cavities. For example, in the case of rectangular cavity, a and b are the length and width of the cavity respectively; in the case of ellipse cavity, a and b are the long and short axes of the cavity respectively; in the case of circular cavity, a=b is the radius of the cavity. The actual dimension of the cavities can be defined by the slit 210. It should be noted that, although both square and circular cavities, as well as cavities with other shapes, can be used, evaluation of the Q-factor for cavities with different shapes demonstrates that circular cavities, including those illustrated in FIGS. 2A-B and 3A-B, have superior Q-values and higher frequency ratios than those of cavities with other shapes. Other advantages of using a circular cavity for the RDA structure 200 can include additional symmetry, better feeding structure design and circuit layout, and ease of fabrication. In the case of a circular cavity for the RDA structure 200, the outer band 220 can be a ring.

In FIG. 3A, mode $TM_{010}$ is illustrated at 310, and in FIG. 3B, mode $TM_{110}$ is illustrated at 320. The areas of high concentration of electric energy are shown in dotted lines: element 312 for $TM_{010}$, and element 322 for $TM_{110}$. In order to adjust the ratio of mode frequencies $f_{TM110}/f_{TM010}$ to be closer to 2, the effective permittivity of one or both modes can be adjusted. In some embodiments the effective permittivity of the $TM_{110}$ mode can be adjusted and this adjustment is performed substantially without influencing the effective permittivity of the $TM_{010}$ mode. By shaping the outer band 202 and the core structure 204 to define the gaps 206, 208, and optionally by selecting materials with appropriate permittivity for the outer band 202, the core structure 204 and in the gaps 206, 208, the resonant frequencies $f_{TM010}$ and $f_{TM110}$ of both modes ($TM_{010}$ and $TM_{110}$) can be adjusted. In addition, the particular shape, size, location and filling material of the gaps 206, 208 can be used to dictate the ratio of frequencies $f_{TM110}/f_{TM010}$. The characteristics of the gaps 206, 208 can affect the harmonic mode $TM_{110}$ more significantly than the fundamental mode $TM_{010}$, and thus be altered to provide a ratio of frequencies $f_{TM110}/f_{TM010}$ closer to 2.

In some embodiments, the gaps 206, 208 are made up of a particular material which differs from that used for the core structure 204. For example, the gaps 206, 208 are made of the same material as the substrate 110, and can be integrally formed with other portions of the substrate 110. In this example, core structure 204 can be formed of a different material with a higher permittivity than the substrate 110, for instance by removing from the substrate 110 a portion thereof having the shape of the core structure 204, and filling in the substrate with the different material. This approach can be used when it is desired to reduce the resonant frequencies $f_{TM010}$ and $f_{TM110}$, and to adjust the ratio $f_{TM110}/f_{TM010}$. Adjustments to the ratio of frequencies $f_{TM110}/f_{TM010}$ can be performed by selecting an appropriate effective permittivity distribution within the region surrounding the slit 210: this can be performed both by using appropriate materials, and by adjusting the shape and orientation of the core structure 204 and the gaps 206, 208.

With continued reference to FIG. 2B, the slit 212 (and the slit 232, in the cover 230) can be used to cut the surface current of the $TM_{110}$ mode while having a minimal impact on the $TM_{010}$ mode. In this fashion, the slits 212, 232 act as a slot antenna for the $TM_{110}$ mode, for which appropriate width and length selections can be made. With continued reference to FIGS. 3A-B, the RDA structure 200 exhibits four symmetrically-located feeding points 302, 304, 306, and 308. As established previously, the radiator system 100 uses the common port 134 and the low-frequency port 136. This is because feeding points 302 and 306 have electrical coupling only to the $TM_{010}$ mode, whereas feeding points 304 and 308 have coupling to both the $TM_{om}$ and $TM_{110}$ modes. By selecting two adjacent feeding points, a suitable cavity can be formed. In this case, the common port 134 is set at feeding point 304, and the low-frequency port 136 is set at feeding point 306. It should be noted that ports 308 and 302, 308 and 306 or 304 and 302 could also be used.

Thus, the RDA structure 200 acts concurrently as a resonator, a diplexer, and an antenna: the signal at the fundamental frequency $f_0$ and the secondary signal at $2f_0$ are multiplexed, such that the secondary signal at $2f_0$ resonates in the $TM_{110}$ mode substantially via the gaps 206, 208, and is radiated via the slits 212, 232, and such that the signal at the fundamental frequency $f_0$ is output via the low-frequency port 136 and routed to the input 122 of the amplifier 120.

In one particular implementation, the RDA structure 200 is designed to pass electromagnetic signal from the common port 134 to the low-frequency port 136 at around 14 GHz, using the $TM_{010}$ mode. It should be noted that in some embodiments, key dimensions for the RDA structure 200 can be selected using equation (1) above, and based on $$f_{010} = \frac{cp_{01}}{2\pi a\sqrt{\mu_r \varepsilon_r}} \qquad (2)$$

in which c is the speed of the light in vacuum, and $p_{01}$ is the first root of a first kind Bessel function $J_0(x)$, for instance by way of a parametric study with eigenmode simulations. Continuing with the particular implementation, the portions of the loop 140 feeding the common and low-frequency ports 134, 136 can be based on a Rogers RT/duriod 6002 high frequency substrate with a thickness of 0.508 mm. In some embodiments, these portions are placed on the top side of the substrate 110, in order to reduce the coupling of the radiated signal to the ports 134 and 136, and to reduce parasitic radiation from the portions of the loop 140. The covers 220, 230 can be formed of PCB material, much like the substrate 110, and can have a thickness of 0.254 mm. The covers 220, 230 can be bonded to the substrate 110 via a conductive bonding material, adhesive or melted soldering paste.

With reference to FIG. 2A and FIG. 4, in some embodiments the areas above the slits 212 and 232 can be provided with a dielectric to adjust the field intensity within the RDA structure 200, relative to the field intensity resonated and transmitted by the RDA structure 200. For example, a dielectric resonator 402 can be affixed to the RDA structure 200. The size and shape of the dielectric resonator 402 can be selected, as appropriate.

Figure 5:
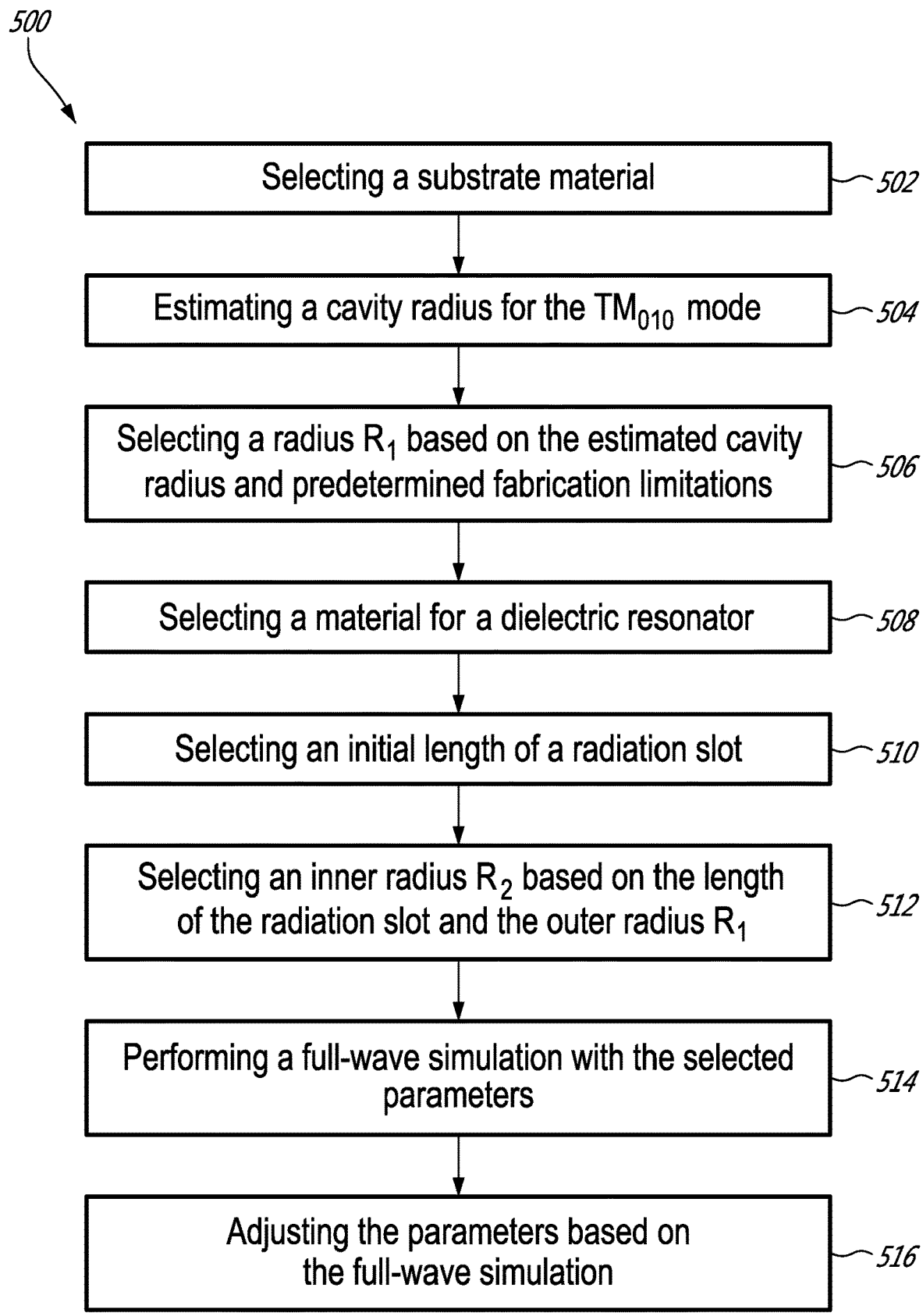
FIG. 5 is a flowchart illustrating a method for designing an RDA structure.

With reference to FIG. 5, a particular embodiment of a design approach for the RDA structure 200 can be defined as a method 500. In some contexts, the method 500 can be performed via, using, or aided by a computing device, as described in greater detail hereinbelow. For example, a computing device can be used to present various information via one or more graphical user interfaces (GUIs), obtain various input, perform various calculations and/or simulations, estimate and/or determine various values, store various values for later retrieval, and the like.

At step 502, a substrate material, for example the substrate 110, is selected. In some embodiments, thicker substrates may be selected for reducing conductor losses in SIW structures. In some embodiments, the substrate material for the substrate 110 is selected via a GUI, for instance from a list of various substrates. For example, a computing device can identify one or more candidate substrates, for instance based on a selected semiconductor process and/or technology, and present a list of the candidate substrates via the GUI. In some embodiments, the computing device can collect various input via the GUI and select a suitable substrate based thereon. Other approaches are also considered.

At step 504, a cavity radius for the $TM_{010}$ mode is estimated with equation (2). In some embodiments, a complete-dielectric-filled circular cavity and a resonating frequency of half the targeted radiation frequency can be selected as assumptions. Other assumptions can also be made, for instance based on a selected semiconductor process and/or technology. In some embodiments, the computing device can perform the estimation for the cavity radius, for instance by implementing equation (2) using any suitable algorithmic and/or computational techniques.

At step 506, a radius $R_1$ for the cavity is selected, based on the estimated cavity radius and predetermined fabrication limitations. The radius $R_1$ substantially corresponds to the inner radius of the outer band 202. At step 508, a dielectric resonator material, for example for the dielectric resonator 402, is selected. In some embodiments, selecting the dielectric resonator material is done on the basis of dielectric loss. At step 510, an initial length of a radiation slot, for example for the slits 212, 232, is selected, for example based on a requisite energy coupling. At step 512, an inner radius $R_2$ is selected, based on the length of the radiation slot and the outer radius $R_1$. For instance, the inner radius $R_2$ can be selected to readily contain the radiation slot. The inner radius $R_2$ substantially corresponds to the radius of the center circle of the core structure 204. In some embodiments, selection of the aforementioned parameters, including the radii $R_1$, $R_2$, the dielectric resonator material, and the initial length of the radiation slot, is performed via a GUI. For example, the computing device identifies one or more candidate values for each of the parameters, for instance based on a selected semiconductor process and/or technology, and present a list of the candidate values via the GUI. In some other embodiments, the computing device identifies suggested values for each of the parameters, for instance based on a selected semiconductor process and/or technology, and can present them via the GUI for confirmation. In some further embodiments, the computing device selects values for the parameters based on various input, for instance received via the GUI. Other approaches are also considered.

At step 514, a full-wave simulation can be performed using the various parameters selected as part of the method 500. At step 516, one or more of the parameters can be adjusted based on the full-wave simulation. In some embodiments, the adjustments can be performed based on input received via the GUI. In some other embodiments, the adjustments can be performed by the computing device, for instance by iteratively changing certain values until a desired outcome is reached. For instance, the computing device can iteratively adjust values for the aforementioned parameters and repeat the full-wave simulation of step 514 until the results of the full-wave simulation indicate a desired level of performance. In some embodiments, the adjustments and simulations can be performed substantially in real-time: for instance, adjustments can be received from input via the GUI, and the computing device can perform subsequent simulations based on the received input, and present the results of the subsequent simulations via the GUI. Once satisfactory parameters are obtained, the design can be stored in a computer-readable medium and/or used to produce one or more RDA structures 200.

Figure 6B:
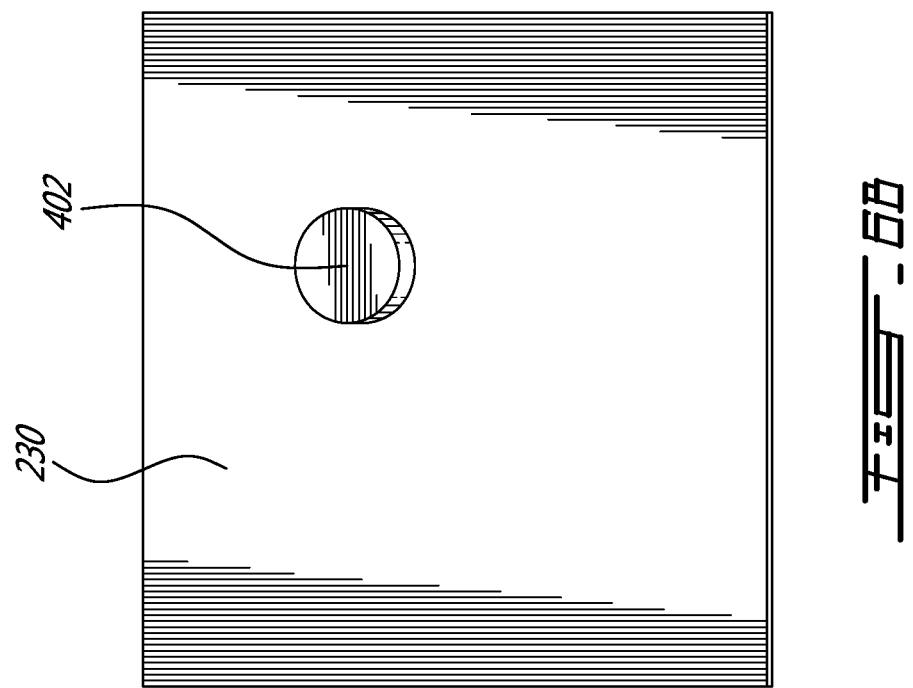
FIGS. 6A-B are top and bottom views of an embodiment of the RDA structure of FIGS. 2A-B.
Figure 6A:
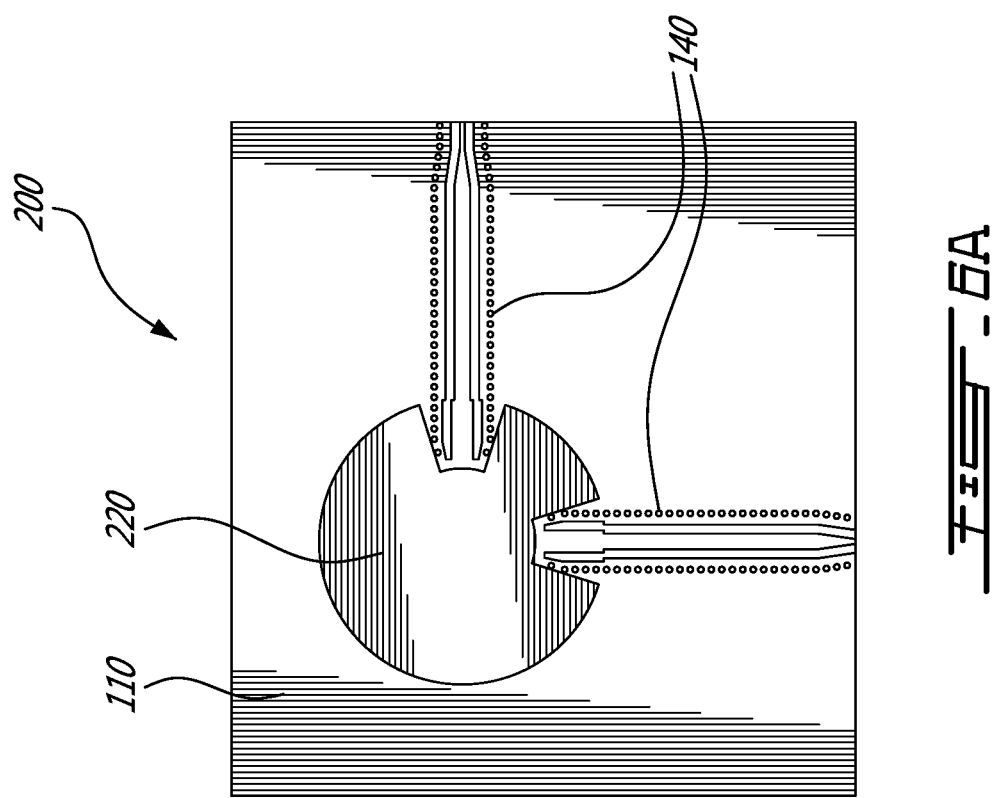

With reference to FIG. 6A and FIG. 6B, an example fabricated and assembled RDA structure 200 is illustrated. FIG. 6A shows the top side and FIG. 6B shows the bottom side of the RDA structure 200. The cover 230 on the bottom side is extended to the edge of the substrate 110. The dielectric resonator 402 in FIG. 6B is affixed on top of the cover 230.

With reference to FIG. 7, in some embodiments, the RDA structure 200 is provided with one or more tuning pins 702. The tuning pins 702 penetrate the cover 220 to reach the gaps 206, 208 and can be used to adjust the response of the gaps 206, 208, in embodiments when the gaps 206, 208 are air-filled. By altering the degree to which the tuning pins 702 are inserted into the gaps 206, 208, the capacitance of the gaps can be modified, thereby adjusting the resonant frequencies of the resonant modes for the RDA structure 200. Depending on the position and the number of the pins, frequencies of different modes may be tuned by different values.

Figure 8:
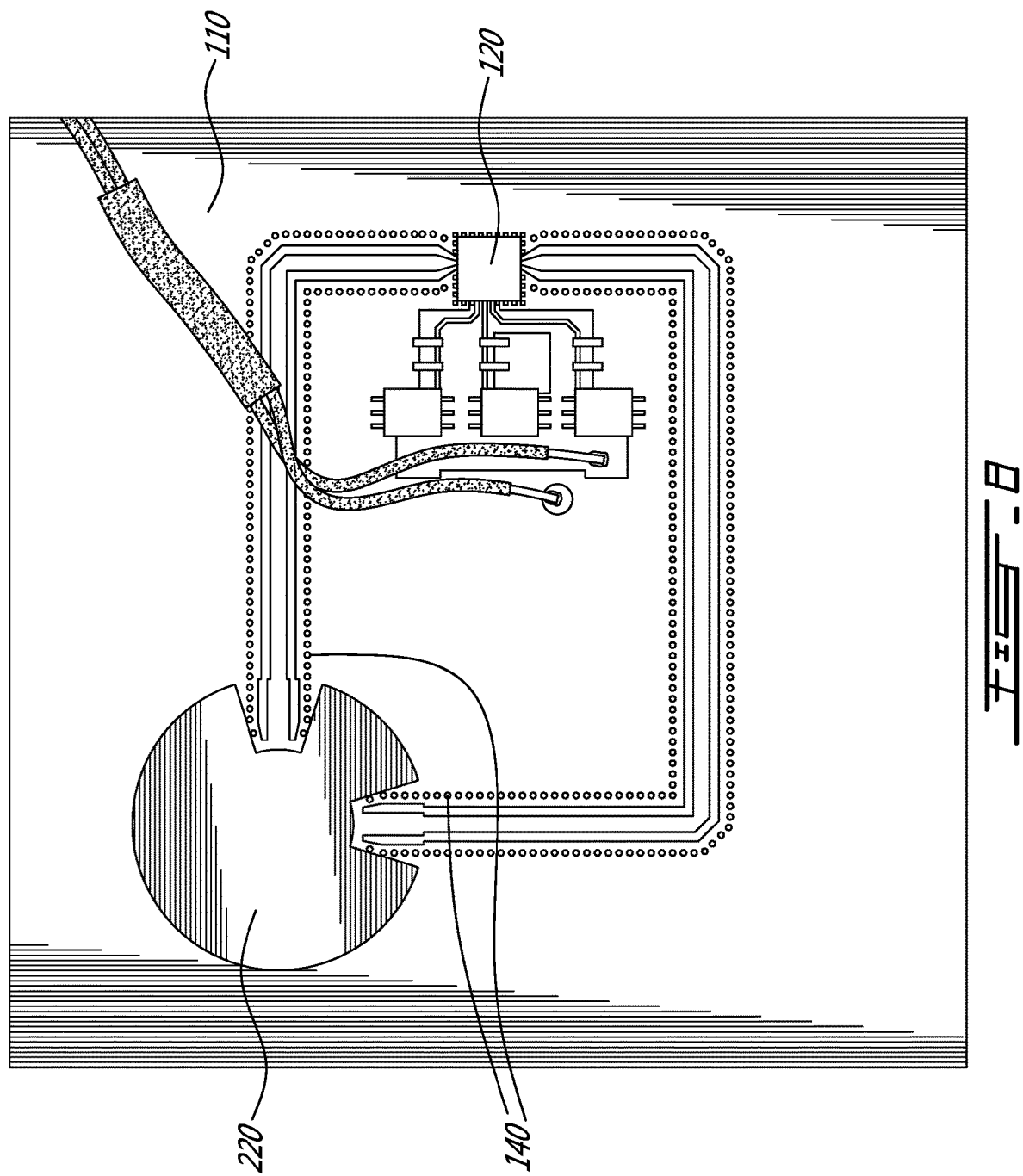
FIG. 8 is the top view of an embodiment of the active radiator with the RDA structure.

With reference to FIG. 8, in one embodiment, an active radiator is formed with the RDA structure 200. The amplifier 120 is coupled to the RDA via loop 140, which is formed on the substrate 110. In some other embodiments, the loop 140 can also be formed on the exposed sides of the covers 220, 230, wherein the amplifier is disposed.

Figure 9:
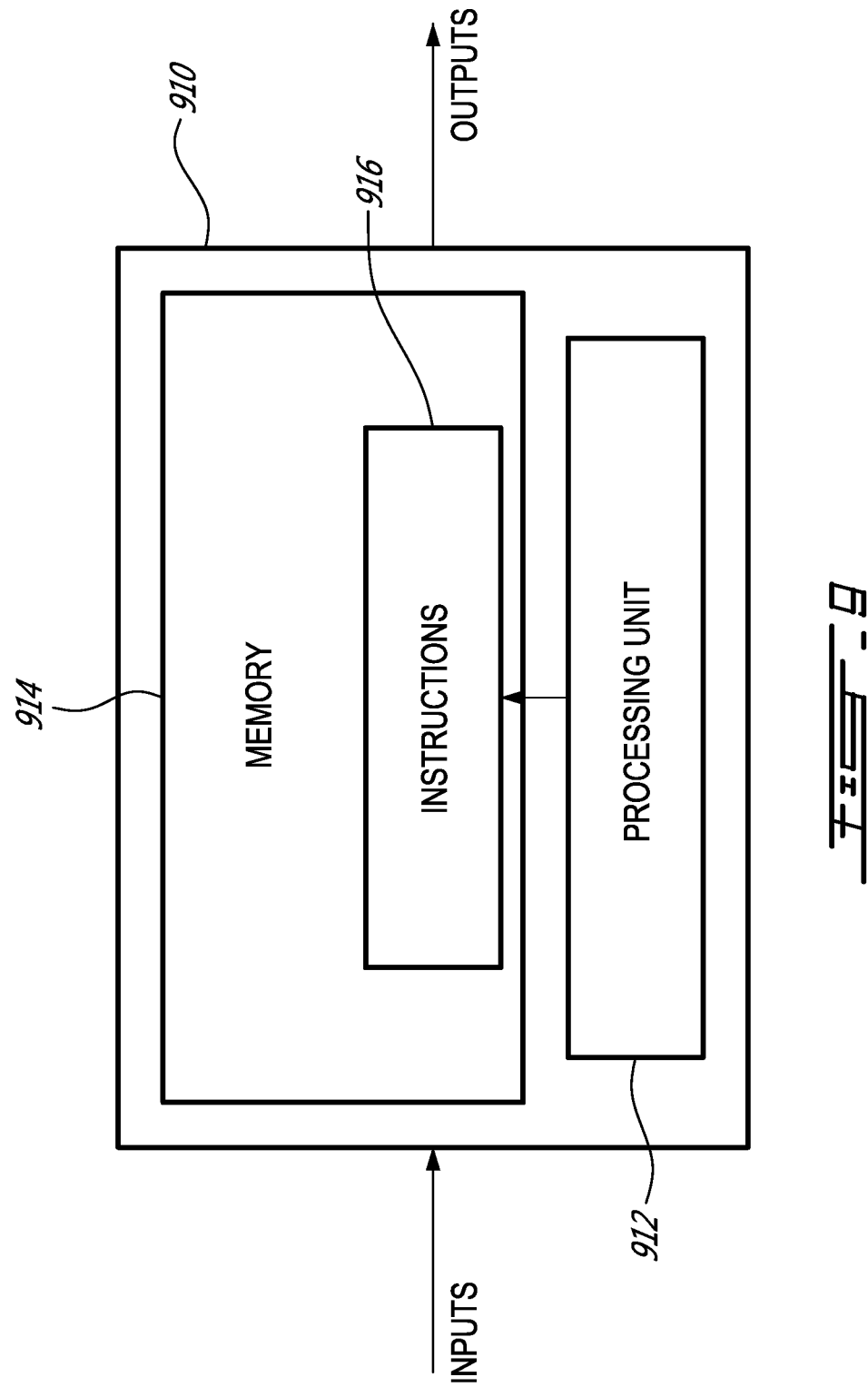
FIG. 9 is a block diagram of an example computing system for implementing the method of FIG. 5.

With reference to FIG. 9, the method 500 may be implemented using a computing device 910 comprising a processing unit 912 and a memory 914 which has stored therein computer-executable instructions 916. The processing unit 912 may comprise any suitable devices configured to implement the system such that instructions 916, when executed by the computing device 910 or other programmable apparatus, may cause the functions/acts/steps of the method 500 as described herein to be executed. The processing unit 912 may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory 914 may comprise any suitable known or other machine-readable storage medium. The memory 914 may comprise non-transitory computer readable storage medium, for example, but not limited to, an electronic, magnetic, optical, electromagnetic, infrared, or semiconductor system, apparatus, or device, or any suitable combination of the foregoing. The memory 914 may include a suitable combination of any type of computer memory that is located either internally or externally to device, for example random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory 914 may comprise any storage means (e.g., devices) suitable for retrievably storing machine-readable instructions 916 executable by processing unit 712.

The methods described herein may be implemented in a high level procedural or object oriented programming or scripting language, or a combination thereof, to communicate with or assist in the operation of a computer system, for example the computing device 910. Alternatively, the methods may be implemented in assembly or machine language. The language may be a compiled or interpreted language. Program code for implementing the methods and systems for detection may be stored on a storage media or a device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein. Embodiments of the methods and systems may also be considered to be implemented by way of a non-transitory computer-readable storage medium having a computer program stored thereon. The computer program may comprise computer-readable instructions which cause a computer, or in some embodiments the processing unit 912 of the computing device 910, to operate in a specific and predefined manner to perform the functions described herein.

Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the disclosed resonator-diplexer-antenna structure, active radiator, associated systems and methods, and other aspects of the present disclosure, may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A resonator-diplexer-antenna (RDA) structure, comprising:
an input port configured for obtaining an input signal;
an outer band defining an outer perimeter and an inner perimeter, the input port coupled to the outer band at a first point thereof, the outer band being configured to accept the input signal from the input port;
a core structure contained and retained within the inner perimeter of the outer band; wherein
the core structure and the outer band define at least one gap between the core structure and the outer band; and
the outer band, core structure, and at least one gap are configured to resonate at a predetermined frequency; and
an output port coupled to the outer band at the second point and configured for outputting an output signal.

2. The structure of claim 1, wherein the input signal comprises m components at m frequencies $f_1, f_2, \ldots f_m$, and wherein the output signal comprises n components at n frequencies $f_1, f_2, \ldots f_n$, wherein the n frequencies are a subset of the m frequencies.

3. The structure of claim 2, wherein the predetermined frequency is different from a frequency of the output signal.

4. The structure of claim 3, wherein the frequency of the output signal is a harmonic frequency of the predetermined frequency.

5. The structure of claim 1, wherein the core structure is formed integrally with the outer band.

6. The structure of claim 1, wherein the core structure is formed separately from the outer band and coupled thereto.

7. The structure of claim 1, further comprising a dielectric material positioned in at least a portion of the at least one gap between the core structure and the outer band.

8. The structure of claim 7, wherein the dielectric material comprises a portion of a substrate on which the outer band is formed.

9. The structure of claim 1, wherein the at least one gap between the core structure and the outer band is at least one air gap.

10. The structure of claim 1, further comprising at least one cover coupled to a substrate on which the outer band is formed and positioned to encompass at least part of the outer band and the core structure.

11. The structure of claim 10, wherein the at least one cover comprises a bottom cover coupled to a bottom surface of the substrate, the bottom cover defining a cover slit which substantially aligns with a slit defined in the core structure.

12. The structure of claim 10, wherein the at least one cover comprises a top cover coupled to a top surface of the substrate, the top cover defining at least one opening, the structure further comprising at least one tuning pin inserted in the at least one opening to adjust a resonance of the at least one gap.

13. The structure of claim 1, wherein the core structure has defined therein a slit for blocking an undesirable signal forming part of the input signal.

14. The structure of claim 1, further comprising a dielectric resonator affixed to at least part of the core structure and/or at least part of the outer band.

15. An active radiator system, comprising:
an amplifier; and
the RDA structure of claim 1, wherein the input port of the RDA structure is coupled to an output port of the amplifier, and wherein the output port of the RDA structure is coupled to an input port of the amplifier.

16. The system of claim 15, wherein the amplifier is configured for receiving the output signal and producing the input signal based on the output signal.

17. The system of claim 16, wherein the amplifier is further configured for producing the input signal based on a length of connectors coupling the amplifier and the RDA structure.

18. The system of claim 15, wherein the RDA structure is coupled to the amplifier via substrate-integrated waveguides.

19. A method for producing a resonator-diplexer-antenna (RDA) structure, comprising:
estimating, for a given substrate material, a cavity radius for a first resonant mode;
selecting, based on the estimated cavity radius, an outer radius and a radiation slot length;
selecting, based on the outer radius and the radiation slot length, an inner radius; and
producing the RDA structure having dimensions based on the cavity radius, the outer radius, the inner radius, and the radiation slot length.

20. The method of claim 19, further comprising:
performing a simulation of a virtual RDA structure based on the cavity radius, the outer radius, the inner radius, and the radiation slot length; and
adjusting at least one of the cavity radius, the outer radius, the inner radius, and the radiation slot length based on the simulation.

* * * * *